US011153962B2

(12) United States Patent
Kimura et al.

(10) Patent No.: US 11,153,962 B2
(45) Date of Patent: Oct. 19, 2021

(54) HEADER FOR SEMICONDUCTOR DEVICE, AND SEMICONDUCTOR DEVICE

(71) Applicant: SHINKO ELECTRIC INDUSTRIES CO., LTD., Nagano (JP)

(72) Inventors: Yasuyuki Kimura, Nagano (JP); Takumi Ikeda, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/829,454

(22) Filed: Mar. 25, 2020

(65) Prior Publication Data

US 2020/0337147 A1 Oct. 22, 2020

(30) Foreign Application Priority Data

Apr. 18, 2019 (JP) .............................. JP2019-079259

(51) Int. Cl.
*H01L 23/492* (2006.01)
*H05K 1/02* (2006.01)
(Continued)

(52) U.S. Cl.
CPC ......... *H05K 1/0203* (2013.01); *H01L 23/492* (2013.01); *H05K 1/115* (2013.01);
(Continued)

(58) Field of Classification Search
CPC ..... H01L 23/045; H01L 23/36; H01L 23/492; H01L 23/13; H01L 23/367;
(Continued)

(56) References Cited

U.S. PATENT DOCUMENTS 5,461,922 A * 10/1995 Koen .................... G01L 19/003
73/756
5,825,054 A * 10/1998 Lee ........................ H01L 33/483
257/98
(Continued)

FOREIGN PATENT DOCUMENTS

JP 2016-225457 12/2016

OTHER PUBLICATIONS

Thermoelectric cooling—Wikipedia_pp. 1-6_Apr. 10, 2019.*

*Primary Examiner* — Timothy J Thompson
*Assistant Examiner* — Guillermo J Egoavil
(74) *Attorney, Agent, or Firm* — IPUSA, PLLC

(57) ABSTRACT

A header for a semiconductor device, includes a main body section having an upper surface, and a cavity formed in the upper surface, a heat dissipation section provided on the upper surface of the main body section, and a wiring board provided inside the cavity. The wiring board includes a substrate having a first principal surface, and a second principal surface provided on an opposite side from the first principal surface, a first conductor pattern provided on the first principal surface, and having a mounting section on which a semiconductor element is mounted, and a second conductor pattern provided on the second principal surface, and bonded to an inner wall surface of the cavity and the heat dissipation section. A portion of the first conductor pattern extends beyond the heat dissipation section when viewed in a thickness direction of the wiring board.

20 Claims, 16 Drawing Sheets

(51) Int. Cl.
*H05K 1/11* (2006.01)
*H05K 1/18* (2006.01)
*H05K 7/14* (2006.01)

(52) U.S. Cl.
CPC ........... *H05K 1/181* (2013.01); *H05K 7/1427* (2013.01); *H05K 2201/066* (2013.01)

(58) Field of Classification Search
CPC ............. H01L 31/0203; H01L 31/0224; H01L 31/022408; H01L 33/483; H01L 33/642; H01L 2224/48091; H01L 2924/00014; H01S 5/022; H01S 5/0425; H01S 5/02212; H01S 5/02345; H01S 5/02375; H01S 5/02469; H05K 1/0203; H05K 1/115; H05K 1/181; H05K 1/117; H05K 1/02; H05K 1/11; H05K 1/18; H05K 3/403; H05K 7/1427; H05K 7/14; H05K 2201/066

USPC ........................................... 361/720; 372/36
See application file for complete search history.

(56) References Cited

U.S. PATENT DOCUMENTS

| | | | |
|---|---|---|---|
| 6,426,591 B1 * | 7/2002 | Yanagisawa | G02B 6/4204 257/E31.117 |
| 7,837,398 B2 * | 11/2010 | Sato | H01S 5/02253 385/92 |
| 2004/0240497 A1 * | 12/2004 | Oomori | H01S 5/02212 372/36 |
| 2005/0121684 A1 * | 6/2005 | Aruga | G02B 6/4204 257/99 |
| 2013/0093069 A1 * | 4/2013 | Lu | H01L 23/49861 257/666 |
| 2016/0352069 A1 | 12/2016 | Kimura et al. | |
| 2019/0037714 A1 * | 1/2019 | Huumala | H05K 5/0213 |
| 2021/0111515 A1 * | 4/2021 | Consoli | H01R 12/716 |

* cited by examiner

HEADER FOR SEMICONDUCTOR DEVICE, AND SEMICONDUCTOR DEVICE

CROSS-REFERENCE TO RELATED APPLICATION

This application is based upon and claims priority to Japanese Patent Application No. 2019-079259, filed on Apr. 18, 2019, the entire contents of which are incorporated herein by reference.

FIELD

Certain aspects of the embodiments discussed herein are related to a header for a semiconductor device, and the semiconductor device.

BACKGROUND

As an example, Japanese Laid-Open Patent Publication No. 2016-225457 describes a header for a semiconductor device, such as an optical semiconductor device, and configured to reduce the manufacturing cost while securing high-frequency characteristics.

However, according to the header described in Japanese Laid-Open Patent Publication No. 2016-225457, the manufacturing cost can be reduced while securing the high-frequency characteristics, however, it is difficult to obtain satisfactory transmission characteristics when frequencies of signals to be transmitted become high.

SUMMARY

Accordingly, it is an object in one aspect of the embodiments to provide the header for the semiconductor device, and the semiconductor device, which can improve the frequencies of the signals that can be transmitted satisfactorily.

According to one aspect of the embodiments, a header for a semiconductor device, includes a main body section having an upper surface, and a cavity formed in the upper surface; a heat dissipation section provided on the upper surface of the main body section; and a wiring board provided inside the cavity, wherein the wiring board includes a substrate having a first principal surface, and a second principal surface provided on an opposite side from the first principal surface, a first conductor pattern provided on the first principal surface, and having a mounting section on which a semiconductor element is mounted, and a second conductor pattern provided on the second principal surface, and bonded to an inner wall surface of the cavity and the heat dissipation section, wherein a portion of the first conductor pattern extends beyond the heat dissipation section when viewed in a thickness direction of the wiring board.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
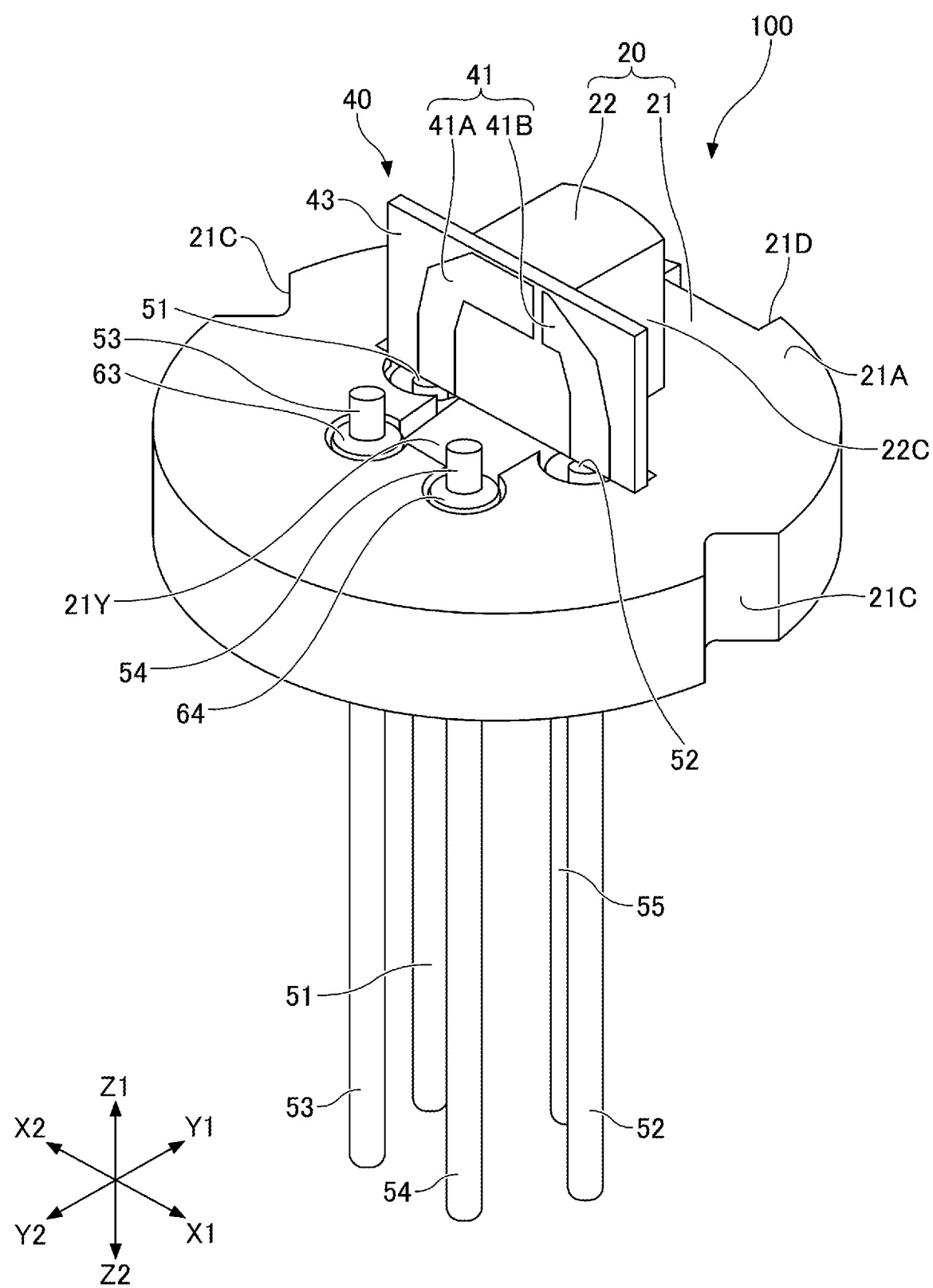
FIG. 1 is a perspective view illustrating a structure of the header for the semiconductor device according to a first embodiment.

Preferable embodiments of the present invention will be described with reference to the accompanying drawings. In the drawings, those constituent elements that are substantially the same are designated by the same reference numerals, and a repeated description of the same parts may be omitted. In the specification, a X1-X2 direction, a Y1-Y2 direction, and a Z1-Z2 direction are mutually perpendicular directions. A plane including the X1-X2 direction and the Y1-Y2 direction will be referred to as a XY-plane, a plan including the Y1-Y2 direction and the Z1-Z2 direction will be referred to as a YZ-plane, and a plan including the Z1-Z2 direction and the X1-X2 direction will be referred to as a ZX-plane. For the sake of convenience, the Z1-Z2 direction is a vertical (or up-and-down) direction. In addition, a plan view refers to a view of a target from the Z1-direction, and a planar shape refers to the shape of the target viewed from the Z1-direction. Of course, the header for the semiconductor device may be used in an up-side-down state, or may be used in an inclined state oriented at an arbitrary inclination angle.

First Embodiment

Figure 2:
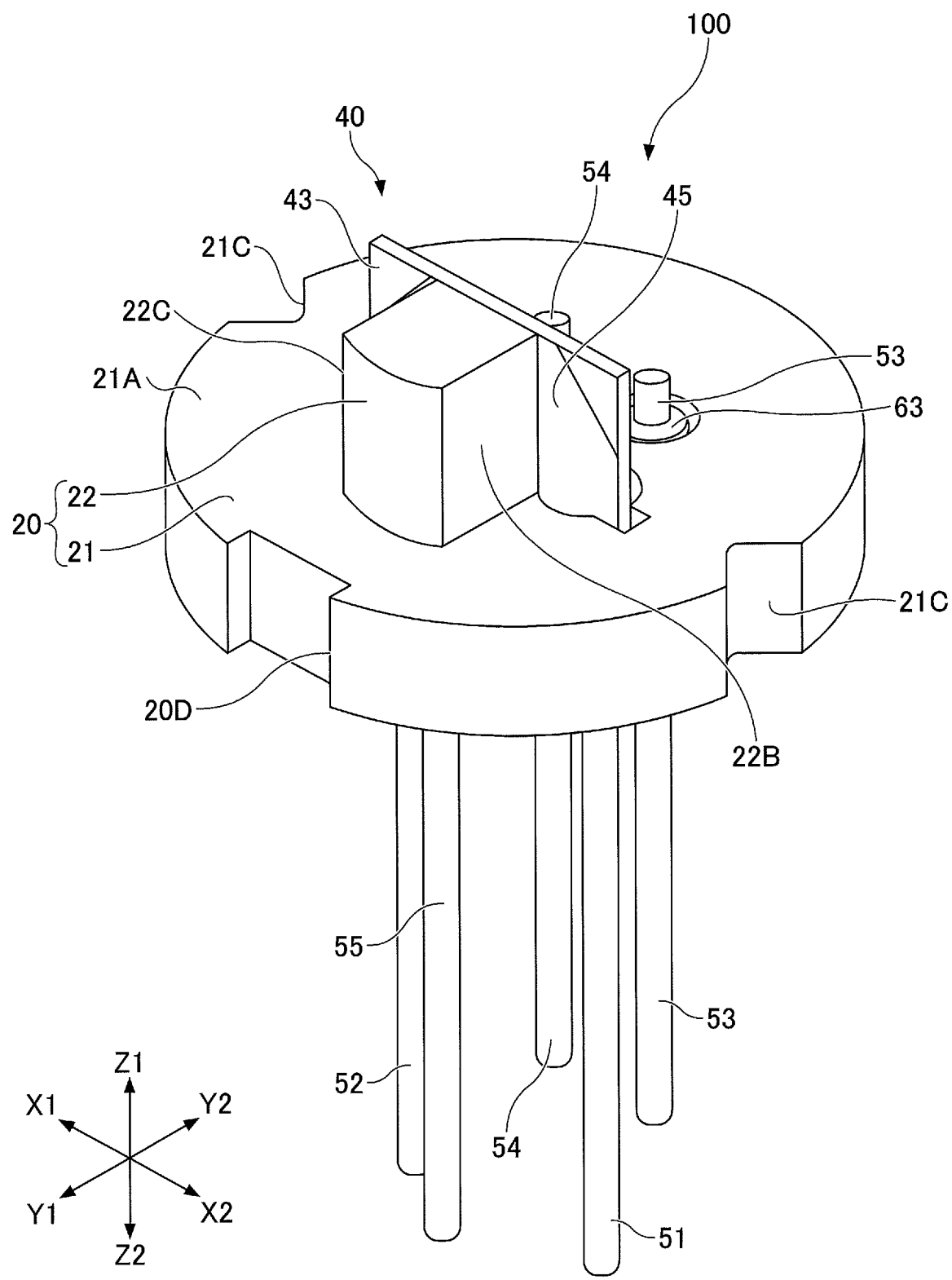
FIG. 2 is a perspective view illustrating the structure of the header for the semiconductor device according to the first embodiment.
Figure 3:
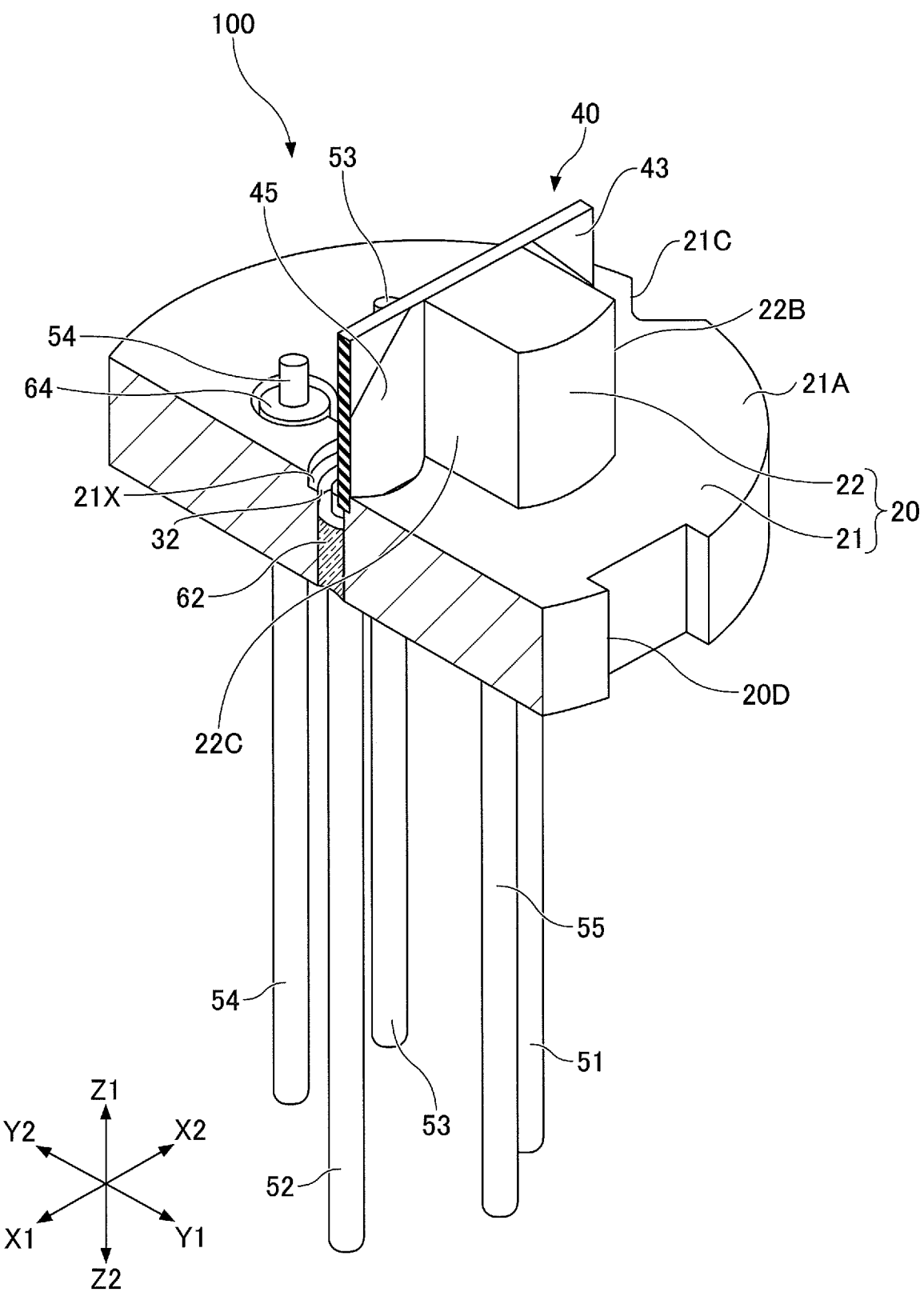
FIG. 3 is a cross sectional view, in part, illustrating the structure of the header for the semiconductor device according to the first embodiment.
Figure 4:
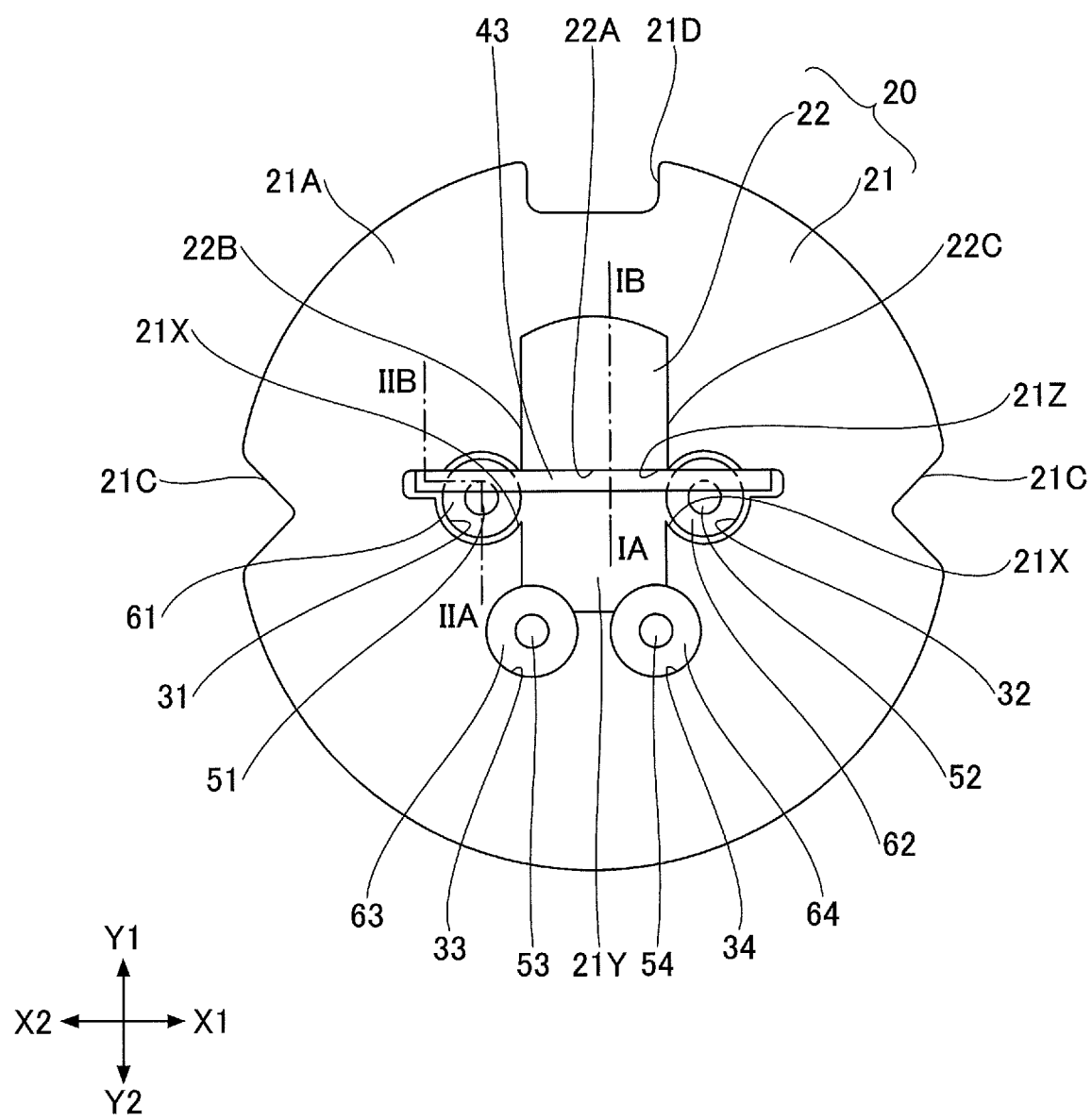
FIG. 4 is a top view illustrating the structure of the header for the semiconductor device according to the first embodiment.
Figure 5:
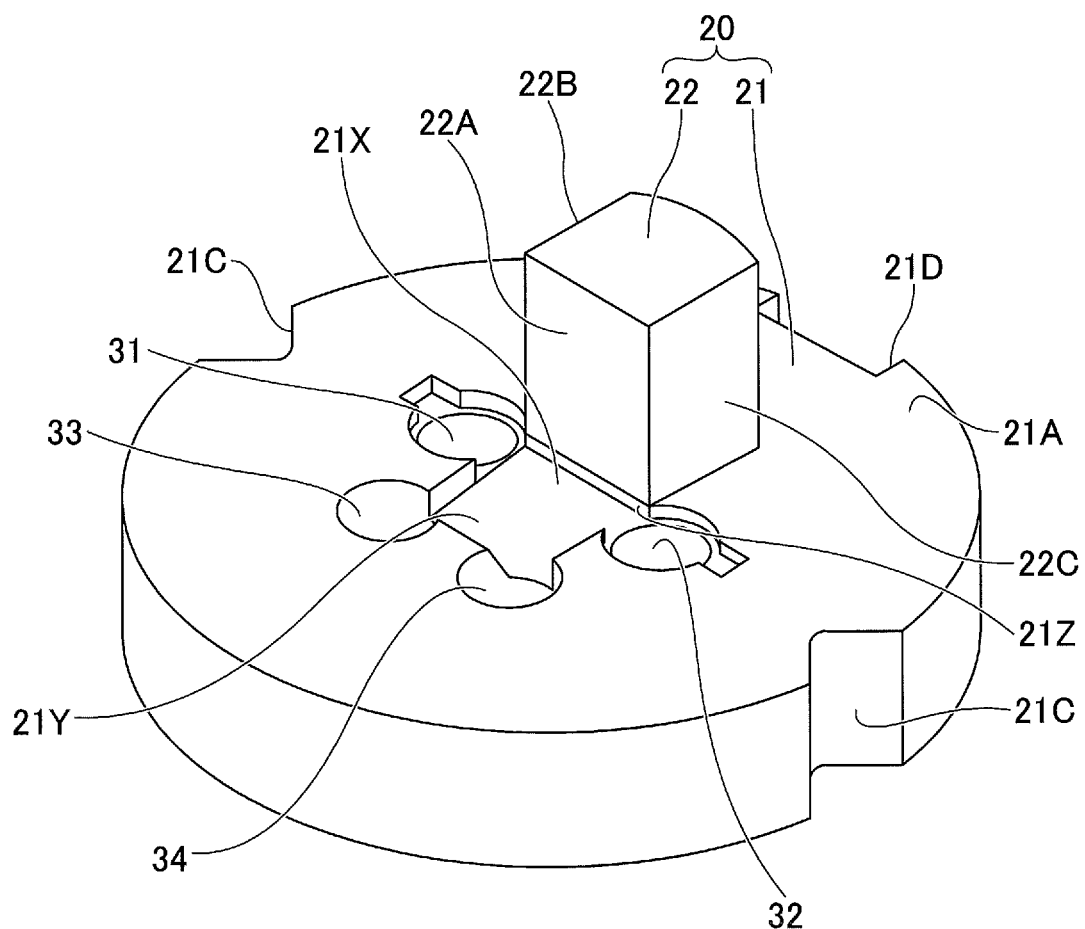
FIG. 5 is a perspective view illustrating a structure of an eyelet according to the first embodiment.
Figure 5:
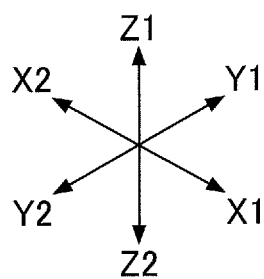

First, a first embodiment will be described. The first embodiment relates to the header for the semiconductor device. FIG. 1 and FIG. 2 are perspective views illustrating a structure of the header for the semiconductor device according to the first embodiment. FIG. 3 is a cross sectional view, in part, illustrating the structure of the header for the semiconductor device according to the first embodiment. FIG. 4 is a top view illustrating the structure of the header for the semiconductor device according to the first embodiment. FIG. 5 is a perspective view illustrating a structure of an eyelet according to the first embodiment. FIG. 1, FIG. 2, and FIG. 3 are views from different observation points. FIG. 1 and FIG. 5 are views from the same observation point.

As illustrated in FIG. 1 through FIG. 4, a header 100 for the semiconductor device according to the first embodiment includes a main body section 21, a heat dissipation section 22, and a wiring board 40. For example, the main body section 21 and the heat dissipation section 22 are integrally formed, to form an eyelet 20.

The main body section 21 and the heat dissipation section 22 function as a heat dissipation plate that releases heat generated from a semiconductor element mounted on the header 100. For this reason, the material used for the main body section 21 and the heat dissipation section 22 is preferably a metal having a good (that is, a sufficiently high) thermal conductivity. In addition, the material used for the main body section 21 and the heat dissipation section 22 preferably has a coefficient of thermal expansion close to coefficients of thermal expansion of the wiring board 40 and the semiconductor element mounted on the wiring board 40. Examples of the material used for the main body section 21 and the heat dissipation section 22 and satisfying the above described conditions include iron, steel, or the like, for example.

As illustrated in FIG. 5, the main body section 21 has a circular plate shape (or disk shape), for example. A diameter of the main body section 21 may be approximately 5.6 mm to approximately 9.0 mm, for example. A thickness of the main body section 21 may be approximately 1.0 mm to approximately 2.0 mm, for example. In this specification, the circular plate shape (or disk shape) refers to a planar shape that is approximately circular, and having a predetermined thickness. The thickness of the circular plate shape with respect to the diameter of the circular plate shape is not particularly limited. In addition, the circular plate shape also includes a generally circular plate shape partially formed with at least one of a concave portion and a convex portion.

In the plan view, an outer edge portion of the main body section 21 includes two cutouts 21C that cave in from an outer periphery toward a center of the main body section 21. The cutouts 21C may be used to position the semiconductor element on the header 100 when mounting the semiconductor element on a mounting surface, for example. The two cutouts 21C may be arranged at diametrically opposite positions, for example. Each of the cutouts 21C may have a planar shape that is an approximate V-shape, for example.

In the plan view, the outer edge portion of the main body section 21 also includes a cutout 21D that caves in from the outer periphery toward the center of the main body section 21, separately from the cutouts 21C. The cutout 21D may be used to position the header 100 along a rotating direction, for example. The cutout 21D may have a planar shape that is an approximate U-shape. The cutouts 21C and 21D may be provided, as appropriate, and thus, these cutouts 21C and 21D may be omitted.

A cavity 21X is formed in an upper surface 21A of the main body section 21. The cavity 21X includes an inner wall surface 21Z, and the wiring board 40 follows this inner wall surface 21Z. The inner wall surface 21Z is a flat surface that is approximately perpendicular to the upper surface 21A. In other words, the inner wall surface 21Z is a flat surface that is provided parallel to the XZ-plane.

Through holes 31 and 32, that are formed in the main body section 21, penetrate the main body section 21 along a thickness direction, that is, the Z1-Z2 direction. The through holes 31 and 32 are provided side by side along the X1-X2 direction. The through hole 31 is provided at a position on the X1-side of the through hole 32. The through holes 31 and 32 are formed on an inner side of the cavity 21X, for example.

Through holes 33 and 34, that are formed in the main body section 21, also penetrate the main body section 21 along the thickness direction, that is, the Z1-Z2 direction. The through holes 33 and 34 are provided side by side along the X1-X2 direction. The through holes 33 and 34 are separated more from the heat dissipation section 22, that is, provided more on the Y2-side, than the through holes 31 and 32. The through hole 33 is provided at a position on the X1-side of the through hole 34. The through holes 33 and 34 are formed on an outer side of the cavity 21X, for example.

As illustrated in FIG. 4, FIG. 5, or the like, the heat dissipation section 22 is formed to a block shape, for example, and is provided on the upper surface 21A of the main body section 21. The heat dissipation section 22 includes a mounting surface 22A that is approximately parallel to the X1-X2 direction in which the through holes 31 and 32 are arranged side by side. The mounting surface 22A is a flat surface that is approximately perpendicular to the upper surface 21A. In other words, the mounting surface 22A is a flat surface provided parallel to the XZ-plane. A lower end of the mounting surface 22A connects to the inner wall surface 21Z of the cavity 21X, and the mounting surface 22A coincides with the inner wall surface 21Z, for example. The wiring board 40 on which the semiconductor element is mounted, is mounted on the mounting surface 22A in a state where the wiring board 40 follows the inner wall surface 21Z. In the state where the wiring board 40 is mounted on the mounting surface 22A, a length of the mounting surface 22A along the X1-X2 direction is shorter than a length of the wiring board 40 along the X1-X2 direction.

The heat dissipation section 22 includes flat side surfaces 22B and 22C that are parallel to the YZ-plane and connect to the mounting surface 22A. Along the X1-X2 direction, for example, the side surface 22B is positioned between an edge on the X2-side of the mounting surface 22A and a center of the through hole 31, and the side surface 22C is positioned between the edge on the X1-side of the mounting surface 22A and a center of the through hole 32. In addition, in the plan view, for example, no overlapping portion exists between the heat dissipation section 22 and the through holes 31 and 32.

A signal lead 51 is inserted into the through hole 31, a signal lead 52 is inserted into the through hole 32, a monitoring lead 53 is inserted into the through hole 33, and a monitoring lead 54 is inserted into the through hole 34. In addition, a grounding lead 55 is connected to a lower surface of the main body section 21. As will be described later, the signal leads 51 and 52 are the so-called nail head leads (or nail type leads), for example. Examples of the material used for the signal leads 51 and 52, the monitoring leads 53 and 54, and the grounding lead 55 may include iron alloys such as Kovar, Alloy 52 (or 52 Alloy), or the like, for example.

An axial direction of the signal lead 51 is inserted into the through hole 31 toward the thickness direction (Z1-Z2 direction) of the main body section 21. An upper end surface of the signal lead 51 is positioned to approximately coincide with a bottom surface of the cavity 21X, for example. A lower portion of the signal lead 51 is formed to project downward from the lower surface of the main body section 21.

A periphery of the signal lead 51 is sealed by a sealer 61 inside the through hole 31. In other words, the signal lead 51 is inserted into the through hole 31 and fixed in a state where the signal lead 51 is sealed airtight by the sealer 61. More particularly, the signal lead 51 is sealed airtight inside the through hole 31 by the sealer 61 filling the through hole 31. The sealer 61 is formed to seal an outer peripheral surface of the signal lead 51 that is arranged inside the through hole 31, and the sealer 61 fills a space between the outer peripheral surface of the signal lead 51 and an inner wall surface of the through hole 31. The sealer 61 has a function to secure an insulation distance (or electrical clearance) between the signal lead 51 and the eyelet 20, a function to fix the signal lead 51 inside the through hole 31, and a function to secure a characteristic impedance.

An axial direction of the signal lead 52 is inserted into the through hole 32 toward the thickness direction (Z1-Z2 direction) of the main body section 21. An upper end surface of the signal lead 52 is positioned to approximately coincide with the bottom surface of the cavity 21X, for example. A lower portion of the signal lead 52 is formed to project downward from the lower surface of the main body section 21.

A periphery of the signal lead 52 is sealed by a sealer 62 inside the through hole 32. In other words, the signal lead 52 is inserted into the through hole 32 and fixed in a state where the signal lead 52 is sealed airtight by the sealer 62. More particularly, the signal lead 52 is sealed airtight inside the through hole 32 by the sealer 62 filling the through hole 32. The sealer 62 is formed to seal an outer peripheral surface of the signal lead 52 that is arranged inside the through hole 32, and the sealer 62 fills a space between the outer peripheral surface of the signal lead 52 and an inner wall surface of the through hole 32. The sealer 62 has a function to secure an insulation distance (or electrical clearance) between the signal lead 52 and the eyelet 20, and a function to fix the signal lead 52 inside the through hole 32.

Examples of the material used for the sealers 61 and 62 may include glass and insulating resins, for example. The glass may be soft glass typically having a relative permittivity of approximately 6.7, for example.

A coefficient of thermal expansion of the sealers 61 and 62 (for example, soft glass) is higher than a coefficient of thermal expansion of the eyelet 20 (for example, iron or steel). For this reason, the sealers 61 and 62 are tightened from the side of the eyelet 20. Accordingly, the through holes 31 and 32 are sealed airtight by the sealers 61 and 62, respectively, and the signal leads 51 and 52 are insulated from the eyelet 20 and fixed by the sealers 61 and 62, respectively, to form coaxial lines. In other words, portions of the signal leads 51 and 52, where the signal leads 51 and 52 are inserted into the through holes 31 and 32 and sealed airtight by the sealers 61 and 62, respectively, become the coaxial lines having core wires formed by the signal leads 51 and 52.

In these coaxial lines, the characteristic impedance of the signal leads 51 and 52 may be adjusted to desired values, by suitably adjusting an opening diameter (or inner diameter) of the through holes 31 and 32, a diameter (outer diameter) of the signal leads 51 and 52, and the relative permittivity of the sealers 61 and 62. In the header 100 according to this embodiment, the opening diameter of the through holes 31 and 32 is suitably adjusted so that the characteristic impedance of the signal leads 51 and 52 becomes the desired value (for example, 25Ω).

An axial direction of the monitoring lead 53 is inserted into the through hole 33 toward the thickness direction (Z1-Z2 direction) of the main body section 21, and the monitoring lead 53 is sealed airtight by a sealer 63. In other words, the monitoring lead 53 is inserted into the through hole 33 and fixed in a state where the monitoring lead 53 is sealed airtight by the sealer 63. The monitoring lead 53 is formed to an approximately cylindrical shape. An upper portion of the monitoring lead 53 is formed to project upward from the upper surface 21A of the main body section 21. In addition, a lower portion of the monitoring lead 53 is formed to project downward from the lower surface of the main body section 21.

An axial direction of the monitoring lead 54 is inserted into the through hole 34 toward the thickness direction (Z1-Z2 direction) of the main body section 21, and the monitoring lead 54 is sealed airtight by a sealer 64. In other words, the monitoring lead 54 is inserted into the through hole 34 and fixed in a state where the monitoring lead 54 is sealed airtight by the sealer 64. The monitoring lead 54 is formed to an approximately cylindrical shape. An upper portion of the monitoring lead 54 is formed to project upward from the upper surface 21A of the main body section 21. In addition, a lower portion of the monitoring lead 54 is formed to project downward from the lower surface of the main body section 21.

A material similar to the material used for the sealers 61 and 62, such as soft glass, for example, may be used for the sealers 63 and 64.

Figure 6A:
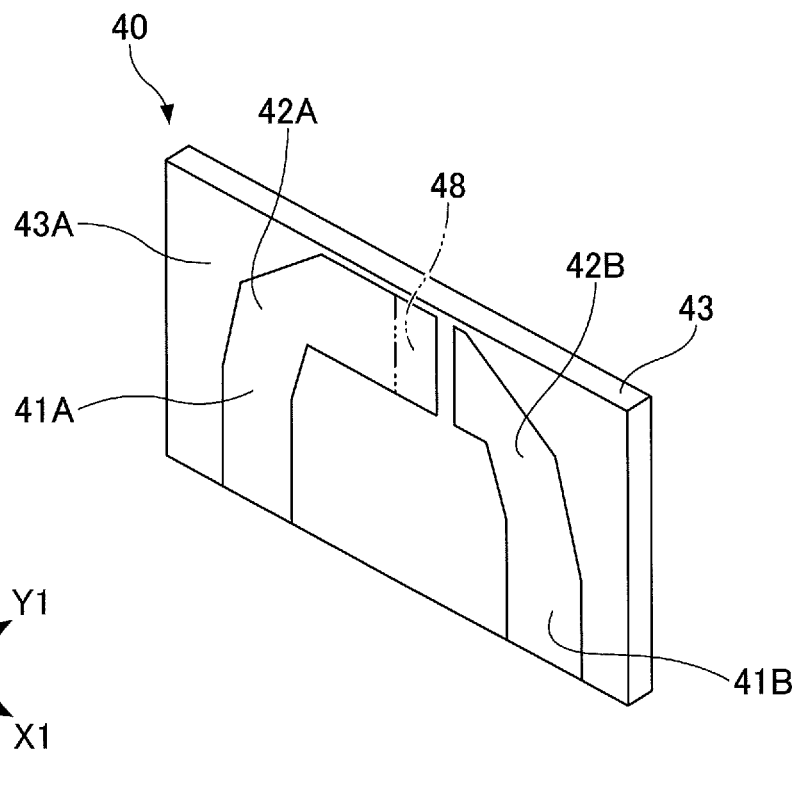
FIG. 6A and FIG. 6B are perspective views illustrating a structure of a wiring board according to the first embodiment.
Figure 6B:
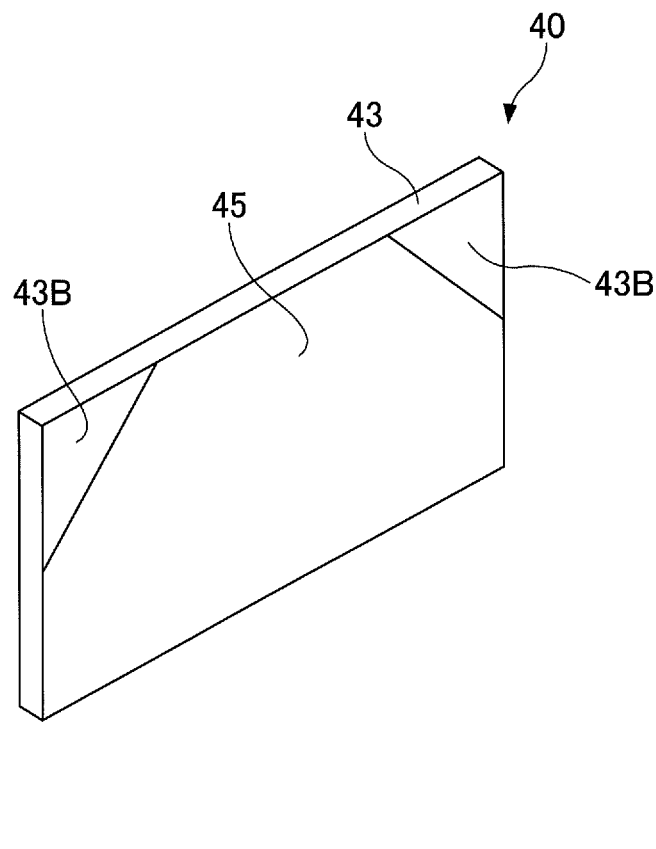

Next, the wiring board 40 will be described. FIG. 6A and FIG. 6B are perspective views illustrating a structure of the wiring board 40 according to the first embodiment. The observation points differ between FIG. 6A and FIG. 6B.

As illustrated in FIG. 6A and FIG. 6B, the wiring board 40 includes a substrate 43 having a first principal surface 43A, and a second principal surface 43B on an opposite side from the first principal surface 43A. A material used for the substrate 43 preferably has a high thermal conductivity and electrical insulation properties, for example. Examples of such a material used for the substrate 43 may include aluminum nitride (AlN) and alumina ($Al_2O_3$), for example. A width (or length along the X1-X2 direction) of the substrate 43 is greater than a width of the mounting surface 22A. The width of the substrate 43 may be approximately 2.4 mm to approximately 2.8 mm, for example. A height of the substrate 43 may be approximately 1.2 mm to approximately 1.4 mm, for example. A thickness of the substrate 43 may be approximately 0.15 mm to approximately 0.3 mm, for example.

A first conductor pattern 41, having a mounting section 48 on which the semiconductor element is mounted, is provided on the first principal surface 43A. The first conductor pattern 41 includes two conductor patterns 41A and 41B that are insulated and separated from each other, for example. The conductor patterns 41A and 41B are metallized patterns, for example. The conductor pattern 41A is formed in correspondence with the signal lead 51, and the conductor pattern 41B is formed in correspondence with the signal lead 52. More particularly, the conductor pattern 41A is formed at a position to connect to the signal lead 51, and the conductor pattern 41B is formed at a position to connect to the signal lead 52, when the wiring board 40 is mounted on the mounting surface 22A. The conductor patterns 41A and 41B have an approximate L-shape when viewed from the Y2-direction, for example. The mounting section 48 is provided at an end portion of the conductor pattern 41A on the side of the conductor pattern 41B, for example.

The conductor pattern 41A is formed to extend parallel to the axial direction (Z1-Z2 direction in this example) of the signal lead 51, from a lower end surface of the substrate 43 toward an upper portion of the substrate 43. Similarly, the conductor pattern 41B is formed to extend parallel to the axial direction (Z1-Z2 direction in this example) of the signal lead 52, from the lower end surface of the substrate 43 toward the upper portion of the substrate 43. In addition, a bent portion 42A, that bends to approach the conductor pattern 41B, is formed at an upper end portion of the conductor pattern 41A, and a bent portion 42B, that bends to approach the conductor pattern 41A, is formed on an upper end portion of the conductor pattern 41B. Further, lower end portions of the conductor patterns 41A and 41B are exposed from the lower end surface of the substrate 43. Lower end surfaces of the conductor patterns 41A and 41B are formed to coincide with the lower end surface of the substrate 43, for example. A width of the conductor patterns 41A and 41B may be approximately 0.15 mm to approximately 0.3 mm, for example. A thickness of the conductor patterns 41A and 41B may be approximately 0.001 mm to approximately 0.003 mm, for example.

In the wiring board 40, the characteristic impedance of the first conductor pattern 41 may easily be adjusted to a desired value. In the wiring board 40, the characteristic impedance of the first conductor pattern 41 may be adjusted to the desired value, by suitably adjusting the relative permittivity of the substrate 43, the thickness of the substrate 43, the width and thickness of the first conductor pattern 41, or the like, for example.

A second conductor pattern 45 is provided on the second principal surface 43B. The second conductor pattern 45 is a metallized pattern, for example. The second conductor pattern 45 is grounded via the eyelet 20 and the grounding lead 55. Accordingly, the first conductor pattern 41 has a microstripline structure. The second conductor pattern 45 is formed on a portion of the second principal surface 43B. The second conductor pattern 45 has an approximately trapezoidal shape when viewed from the Y1-side, for example.

For example, the second conductor pattern 45 is not formed at upper corner portions on both ends of the substrate 43 along the X1-X2 direction, and the upper corner portions of the substrate 45 are exposed from the second conductor pattern 45. Along the thickness direction (Y1-Y2 direction) of the substrate 43, regions where the second conductor pattern 45 is not formed on the second principal surface 43B generally overlap regions on the first principal surface 43A located above the bent portions 42A and 42B on the outer sides along the X1-X2 direction. On the other hand, along the thickness direction (Y1-Y2 direction) of the substrate 43, a region where the second conductor pattern 45 is formed on the second principal surface 43B overlaps a region where the first conductor pattern 41 is formed on the first principal surface 43A.

A lower end portion of the second conductor pattern 45 is exposed from the lower end surface of the substrate 43. For example, the lower end surface of the second conductor pattern 45 is formed to coincide with the lower end surface of the substrate 43. A thickness of the second conductor pattern 45 may be approximately 0.001 mm to approximately 0.003 mm, for example.

Because the second conductor pattern 45 of the wiring board 40 is grounded via the main body section 21 and the heat dissipation section 22, electrical resistances of the surfaces of the main body section 21 and the heat dissipation section 22 are preferably as low as possible. Accordingly, the surfaces of the main body section 21 and the heat dissipation section 22 are preferably plated with a highly conductive material, such as gold (Au) plating or the like.

Figure 7:
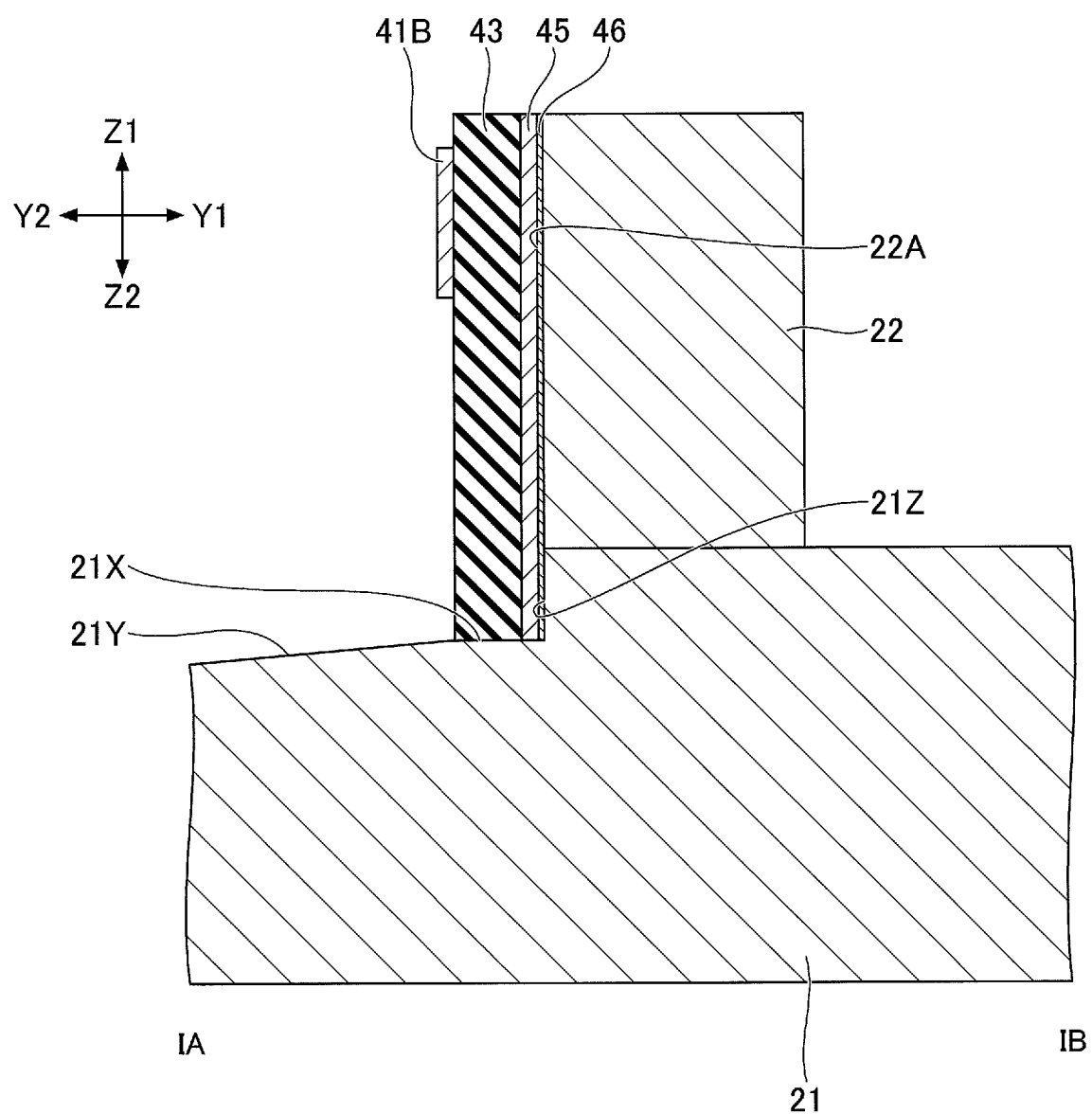
FIG. 7 is a cross sectional view illustrating the structure of the header for the semiconductor device according to the first embodiment.
Figure 8:
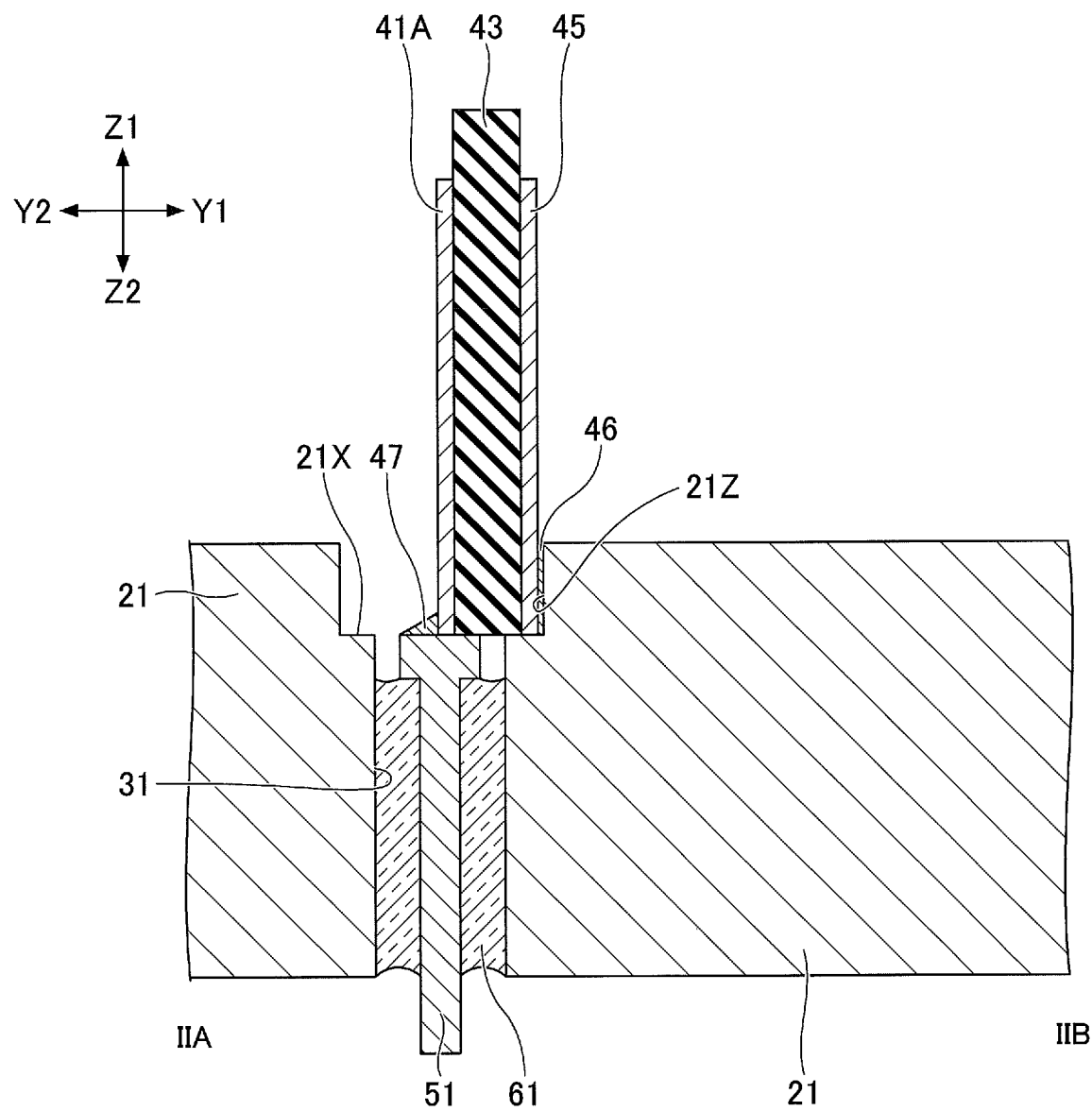
FIG. 8 is a cross sectional view illustrating the structure of the header for the semiconductor device according to the first embodiment.

Next, a connection relationship between the wiring board 40 and the eyelet 20 will be described. FIG. 7 and FIG. 8 are cross sectional views illustrating the structure of the header for the semiconductor device according to the first embodiment. FIG. 7 corresponds to the cross sectional view along a line IA-IB in FIG. 4. FIG. 8 corresponds to the cross sectional view along a line IIA-IIB in FIG. 4.

As illustrated in FIG. 3, FIG. 7, FIG. 8, or the like, the wiring board 40 is provided inside the cavity 21X. Both the inner wall surface 21Z of the cavity 21X and the mounting surface 22A of the heat dissipation section 22 are electrically connected to the second conductor pattern 45 near the signal leads 51 and 52 on the wiring board 40 by brazing, for example, and the lower end surface of the substrate 43 and the upper surface 21A of the main body section 22 are electrically connected to each other. For example, a brazing material 46 is interposed between the second conductor pattern 45 and each of the inner wall surface 21Z and the mounting surface 22A. Examples of the material used for the brazing material 46 include Au—Sn alloys, for example. In addition, as described above, the length of the mounting surface 22A along the X1-X2 direction is shorter than the length of the wiring board 40 along the X1-X2 direction. Accordingly, as illustrated in FIG. 1 or the like, when viewed from the thickness direction of the wiring board 40, portions of the first conductor pattern 41, such as the portions including the bent portions 42A and 42B where the signal transmitting direction changes, for example, extend beyond the heat dissipation section 22. In addition, as illustrated in FIG. 2 or the like, portions of the second conductor pattern 45 also extend beyond the heat dissipation section 22.

As illustrated in FIG. 1, FIG. 4, or the like, the conductor pattern 41A and the signal lead 51 are bonded to each other, and the conductor pattern 41B and the signal lead 52 are bonded to each other, by brazing, for example. As illustrated in FIG. 8, a brazing material 47 is used to bond these elements, for example. Hence, it is possible to ensure that the second conductor pattern 45 is electrically connected to each of the main body section 21 and the heat dissipation section 22, the conductor pattern 41A and the signal lead 51 are electrically connected, and the conductor pattern 41B and the signal lead 52 are electrically connected. In addition, the wiring board 40 is fixed to the eyelet 20. Examples of the material used for the brazing material 47 include Au—Sn alloys, for example.

The bonding of the elements is not limited to the bonding provided by the brazing, and other bonding techniques may be employed, such as bonding using a conductive adhesive, for example.

As illustrated in FIG. 5 or the like, a sloping surface 21Y is famed at the bottom surface of the cavity 21X below (that is, on the Z2-side of) the mounting section 48. The sloping surface 21Y slopes downward from the heat dissipation section 22 toward the Y2-side, between the through hole 31 and the through hole 32 on the XY-plane. When the semiconductor element mounted on the mounting section 48 is a light emitting element, a light receiving element that receives light emitted from the light emitting element may be mounted on the sloping surface 21Y. Electrodes of the light receiving element are connected to the monitoring leads 53 and 54 by bonding wires or the like, for example.

The header 100 may be manufactured according to the following method, for example. The eyelet 20 may be manufactured by integrally forming the main body section 21 and the heat dissipation section 22 by stamping, such as cold forging stamping or the like, for example. In this case, because the heat dissipation section 22 is arranged at a position that does not overlap the through holes 31 and 32 in the plan view, the heat dissipation section 22 and the through holes 31 and 32 may be formed by stamping.

Next, when the sealers 61 and 62 are made of glass, for example, glass powder may be molded using a known powder pressing technique or an extrusion technique, to form molded tubular bodies having inner diameters matching the outer diameters of the signal leads 51 and 52, and outer diameters matching the inner diameters of the through holes 31 and 32. When the sealers 63 and 64 are made of glass, for example, a similar technique may be used to form molded tubular bodies having inner diameters matching the outer diameters of the monitoring leads 53 and 54, and outer diameters matching the inner diameters of the through holes 33 and 34. Then, the molded tubular bodies are inserted into the through holes 31 through 34, respectively, and further, the signal leads 51 and 52 and the monitoring leads 53 and 54 are inserted into the holes in the molded tubular bodies, respectively. After the sealers 61 through 64 forming the molded tubular bodies are melted by heating the molded tubular bodies to a predetermined temperature, the melted sealers 61 through 64 are cooled and solidified. As a result, the signal leads 51 and 52 and the monitoring leads 53 and 54 are sealed by the sealers 61 through 64 inside the through holes 31 through 34, respectively, and the signal leads 51 and 52 and the monitoring leads 53 and 54 are electrically insulated from the eyelet 20 by the sealers 61 through 64, respectively, and fixed.

Next, the lower end of the wiring board 40 is inserted into the cavity 21X, and both the inner wall surface 21Z of the cavity 21X and the mounting surface 22A of the heat dissipation section 22 are bonded to the second conductor pattern 45 of the wiring board 40 by brazing or the like. In addition, the signal lead 51 and the conductor pattern 41A are bonded to each other by brazing or the like, and the signal lead 52 and the conductor pattern 41B are bonded to each other by brazing or the like. These bondings may be performed simultaneously. Alternatively, the bonding of both the inner wall surface 21Z and the mounting surface 22A to the second conductor pattern 45 may be performed before performing the bonding of the signal lead 51 to the conductor pattern 41A and the bonding of the signal lead 52 to the conductor pattern 51B, for example. When bonding the signal lead 51 and the conductor pattern 41A, the sealer 61 can prevent a short-circuit to the eyelet 20. When bonding the signal lead 52 and the conductor pattern 41B, the sealer 62 can prevent a short-circuit to the eyelet 20.

Accordingly, the header 100 for the semiconductor device according to the first embodiment can be manufactured as described above.

Figure 9A:
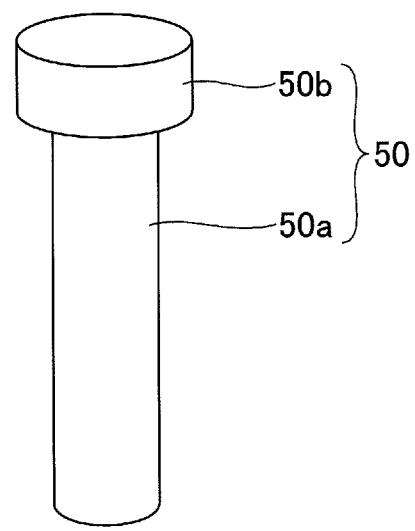
FIG. 9A and FIG. 9B are perspective views illustrating a structure of a nail head lead according to the first embodiment.
Figure 9B:
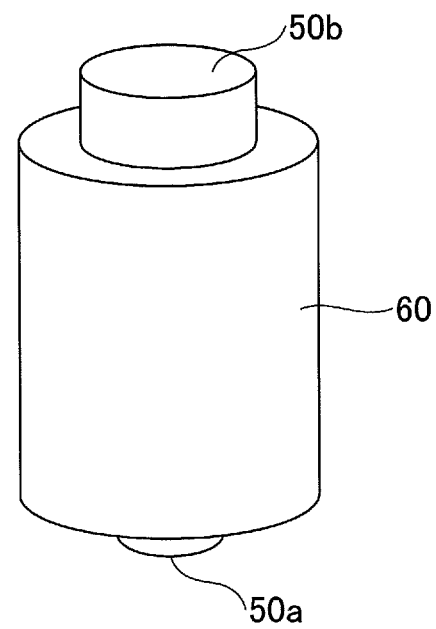

FIG. 9A and FIG. 9B are perspective views illustrating a structure of a nail head lead according to the first embodiment, as an example of the signal leads 51 and 52. A nail head lead 50 illustrated in FIG. 9A and FIG. 9B is an example of the signal leads 51 and 52 according to the first embodiment. As illustrated in FIG. 9A, the nail head lead 90 includes a columnar portion 50a, and a head top portion 50b provided on one end of the columnar portion 50a. A diameter of the head top portion 50b is greater than a diameter of the columnar portion 50a. A cross section of the columnar portion 50a along a section perpendicular to the axial direction thereof has a first cross sectional area. A cross section of the head top portion 50b along a section perpendicular to the axial direction thereof has a second cross sectional area greater than the first cross sectional area. The diameter of the columnar portion 50a may be approximately 0.15 mm to approximately 0.6 mm, for example. As illustrated in FIG. 9B, a sealer 60 made of soft glass may be provided around the columnar portion 50a to seal the through hole. The sealer 60 is an example of the sealers 61 and 62. The characteristic impedance of the signal leads 51 and 52 may be adjusted by adjusting a thickness of the head top portion 50b of the nail head lead 50.

In the header 100 according to the first embodiment, when viewed in the thickness direction of the wiring board 40, portions of the first conductor pattern 41 extend beyond the heat dissipation section 22. For this reason, a signal, such as a high-frequency signal that is transmitted through the first conductor pattern 40, is unlikely to make a wraparound to the heat dissipation section 22. Accordingly, it is possible to reduce signal loss, and improve the frequency of the signal that can be transmitted satisfactorily.

In addition, because the cavity 21X is formed in the upper surface 21A, and the second conductor pattern 45 of the wiring board 40 is electrically connected to the inner wall surface 21Z of the cavity 21X and the mounting surface 22A of the heat dissipation section 22, it is possible to ensure that the wiring board 40 is electrically and thermally connected to the eyelet 20.

Moreover, because the heat dissipation section 22 is located at a position not overlapping the through holes 31 and 32 in the plan view, it is possible to easily form the through holes 31 and 32 and the heat dissipation section 22 by stamping.

Along the thickness direction (Y1-Y2 direction) of the substrate 43, the portions of the second principal surface 43B, generally overlapping the regions on the first principal surface 43A located above the bent portions 42A and 42B on the outer sides along the X1-X2 direction, are exposed from the second conductor pattern 45. For this reason, it is possible to reduce the wraparound of the signal transmitted through the first conductor pattern 41 to the second conductor pattern 45. Consequently, it is possible to reduce the signal loss.

Figure 10:
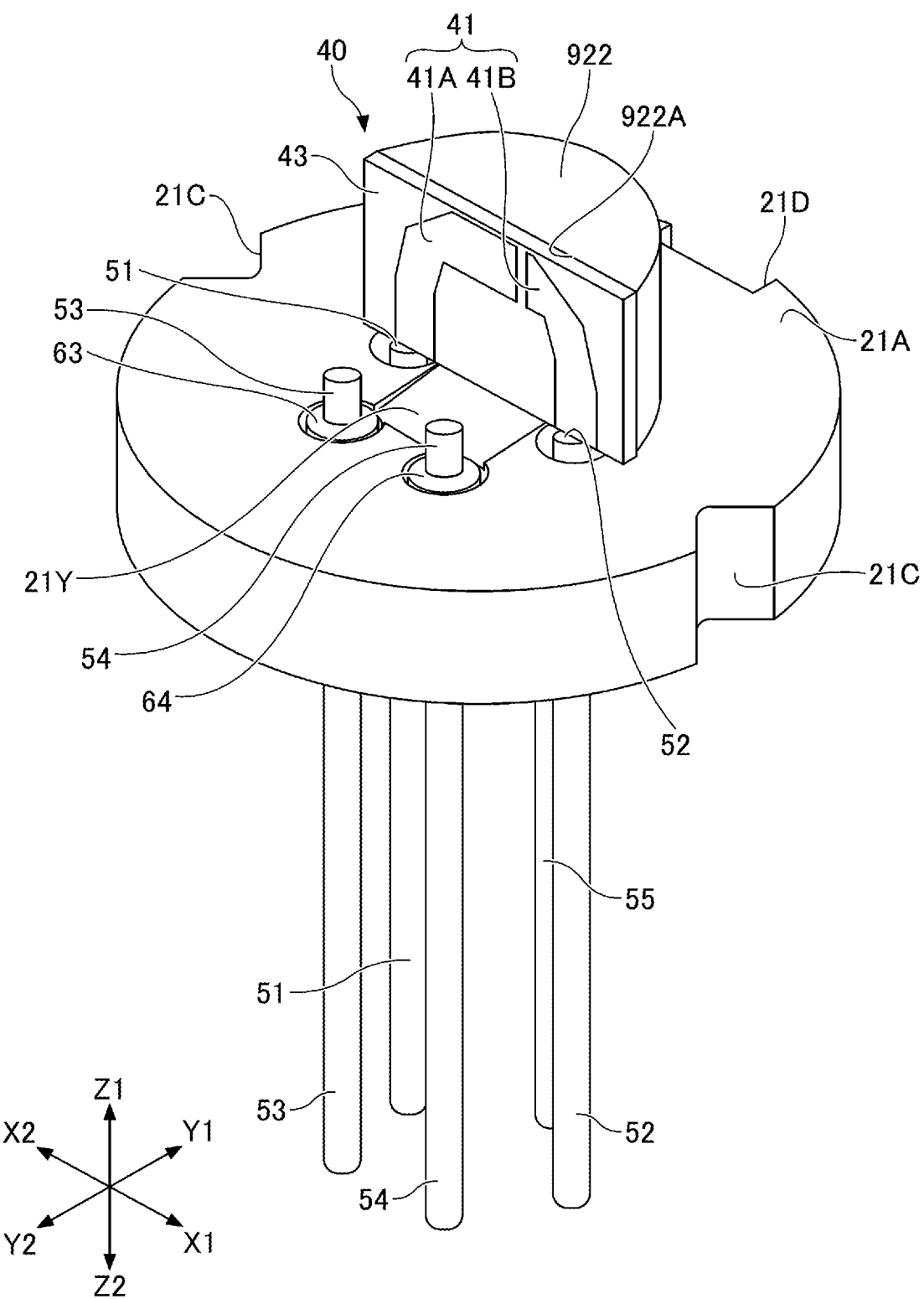
FIG. 10 is a perspective view illustrating a structure of the header for the semiconductor device according to a reference example.

Next, the high-frequency signal transmission characteristics of the header 100 will be described, in comparison with a reference example. FIG. 10 is a perspective view illustrating a structure of the header for the semiconductor device according to the reference example.

As illustrated in FIG. 10, a header 900 for the semiconductor device according to the reference example includes a heat dissipation section 922 in place of the heat dissipation section 22. The heat dissipation section 922 has an approximately semicircular shape in the plan view. In addition, the second conductor pattern is formed on the entire second principal surface 43B of the substrate 43, and the entire second conductor pattern is bonded to a mounting surface 922A of the heat dissipation section 922. No cavity 21X is formed in the upper surface 21A of the main body section 21. Otherwise, the structure of the header 900 is similar to the structure of the header 100 according to the first embodiment described above.

Figure 11:
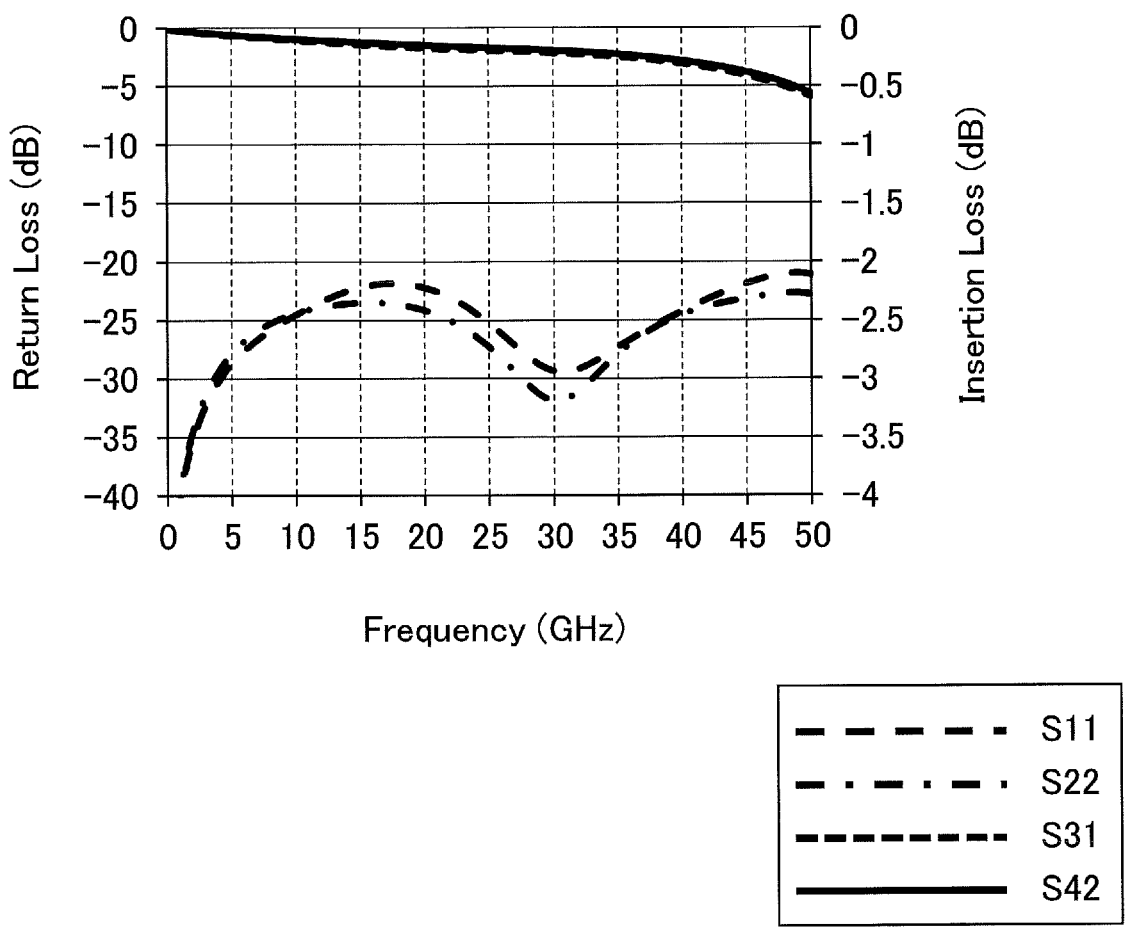
FIG. 11 is a diagram illustrating characteristics of the header for the semiconductor device according to the reference example.
Figure 12:
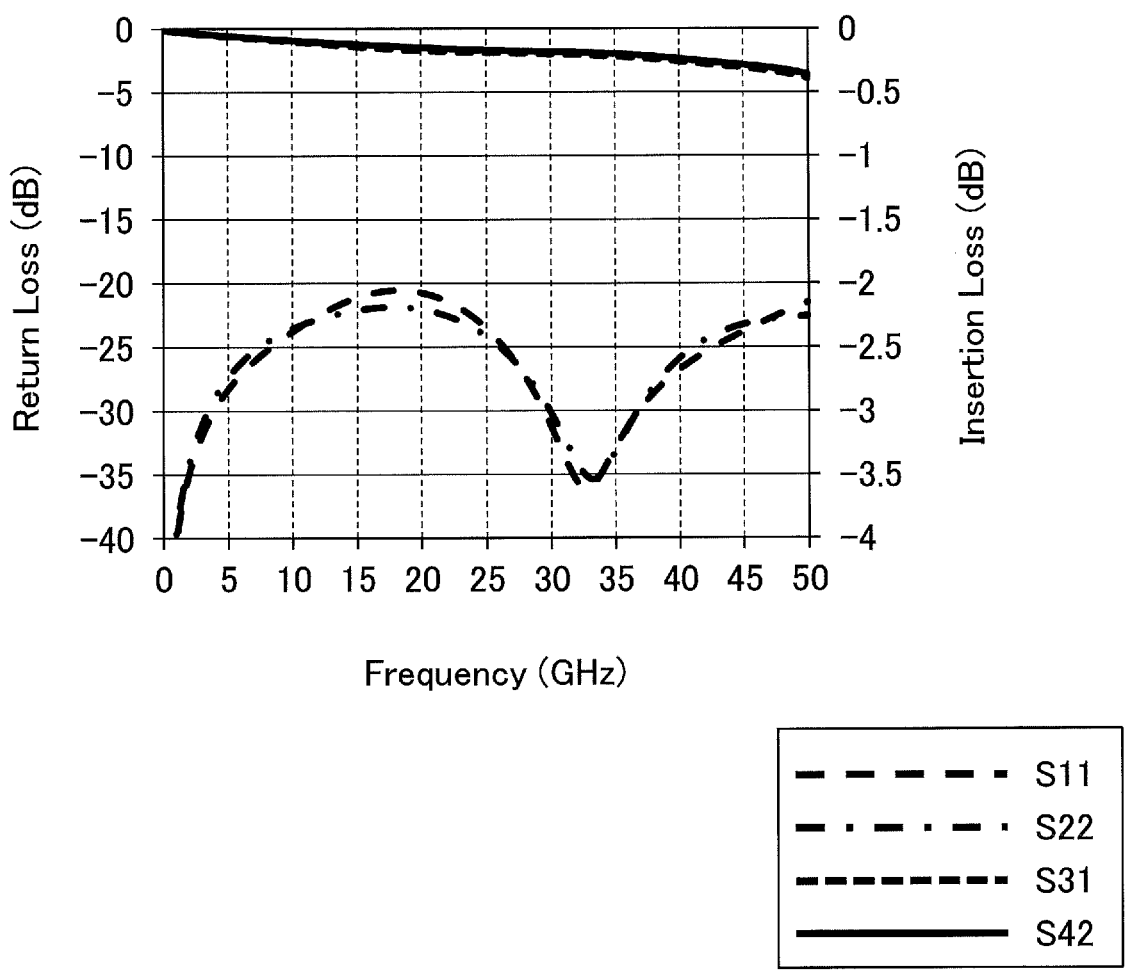
FIG. 12 is a diagram illustrating characteristics of the header for the semiconductor device according to the first embodiment.

FIG. 11 is a diagram illustrating the high-frequency signal transmission characteristics of the header 900 for the semiconductor device according to the reference example. FIG. 12 is a diagram illustrating the high-frequency signal transmission characteristics of the header 100 for the semiconductor device according to the first embodiment. FIG. 11 and FIG. 12 illustrate simulation results of changes in the characteristics caused by characteristics impedance mismatch, computed for cases where internal-external portions of the header 900 and the header 100 are connected to 25Ω characterisics impedance ports. In each of FIG. 11 and FIG. 12, the left ordinate indicates a return loss (dB), the right ordinate indicates an insertion loss (dB), and the abscissa indicates the frequency (GHz). In the simulations, the end portion of the conductor pattern 41A on the side of the signal lead 51 is regarded as a port P1, the end portion of the conductor pattern 41B on the side of the signal lead 52 is regarded as a port P2, the end portion at the upper end of the conductor pattern 41A is regarded as a port P3, and the end portion at the upper end of the conductor pattern 41B is regarded as a port P4, to compute S-parameters S11, S12, S31, and S42.

As illustrated in FIG. 11 and FIG. 12, the header 100 can obtain pass characteristics S31 and S42 in the high-frequency range of 45 GHz to 50 GHz as illustrated in FIG. 12, which are notably superior compared to those of the header 900 illustrated in FIG. 11, and also obtain reflectance characteristics S11 and S12 illustrated in FIG. 12 comparable to those of the header 900 illustrated in FIG. 11. It may be regarded that these advantageous features of the header 100 are obtainable because unnecessary portions of the heat dissipation section 22 and the second conductor pattern 45 are removed from the header 100.

Figure 13:
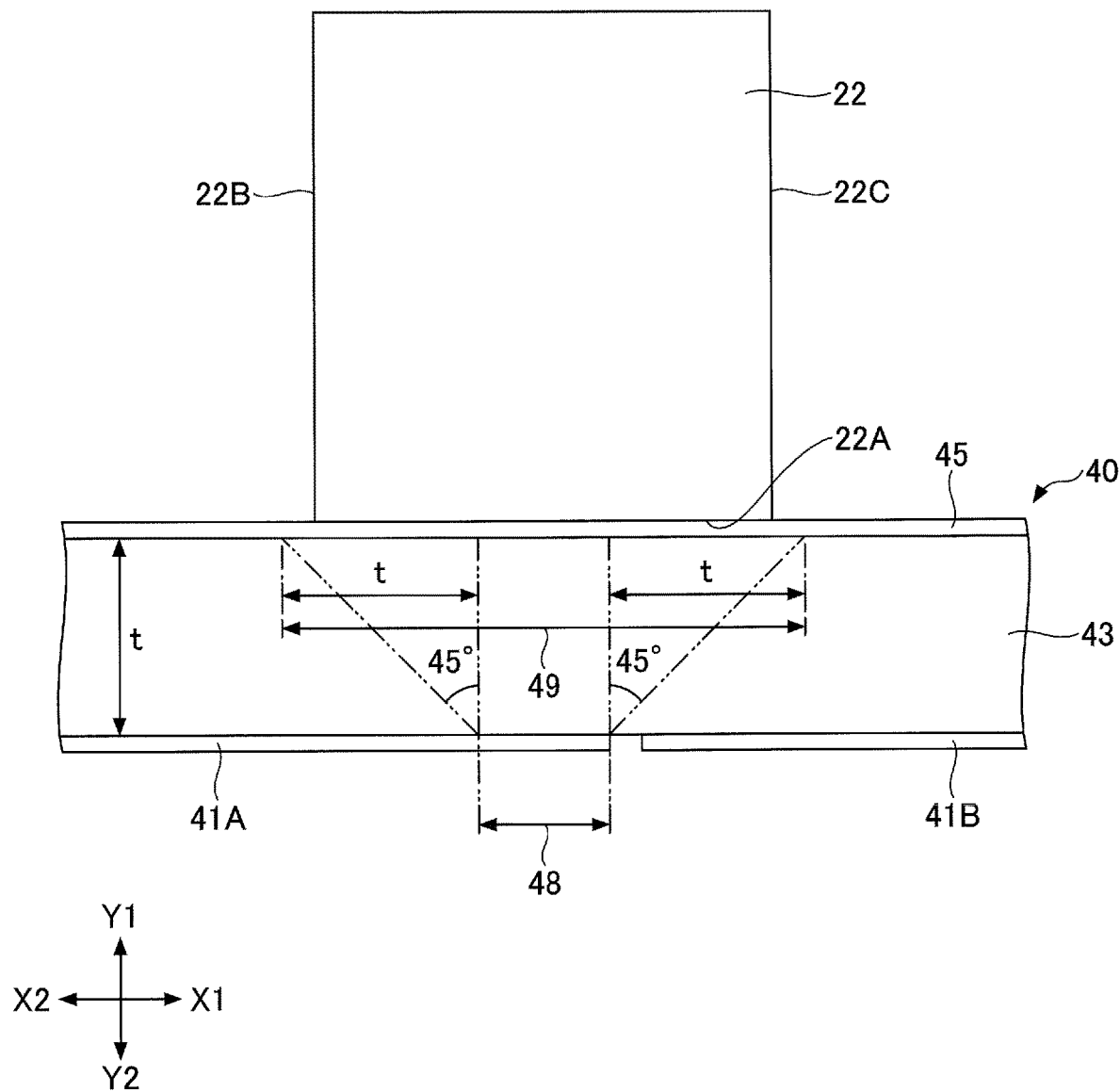
FIG. 13 is a diagram illustrating a preferable size of a heat dissipation section according to the first embodiment.

The size of the heat dissipation section 22 is not particularly limited, however, the size of the heat dissipation section 22 preferably satisfies the following conditions. FIG. 13 is a diagram illustrating a preferable size of the heat dissipation section 22 according to the first embodiment.

From a viewpoint of ensuring superior heat dissipation, the heat dissipation section 22 is preferably bonded to the wiring board 40 in a range at least overlapping the mounting section 48 along the thickness direction (Y1-Y2 direction) of the wiring board 40. This is because the heat generated from the semiconductor element that is mounted on the mounting section 48 may not sufficiently transfer to the heat dissipation section 22 when the range of the wiring board 40 bonded to the heat dissipation section 22 is too small.

From a viewpoint of ensuring superior high-frequency signal transmission characteristics, the heat dissipation section 22 is preferably bonded to the wiring board 40 in a range 49 or smaller, where the range 49 is obtained by adding a thickness t of the wiring board 40 to the range of the heat dissipation section 22 overlapping the mounting section 48 along the thickness direction (Y1-Y2 direction) of the wiring board 40. In other words, the heat dissipation section 22 is preferably bonded to the wiring board 40 in the range 49 or smaller, where the range 49 is obtained by projecting the range in which the mounting section 48 is provided on the first principal surface 43A onto the second principal surface 43B so as to spread by an angle of 45 degrees. The heat generated from the semiconductor element mounted on the mounting section 48 is transferred to the Y1-side while spreading generally at the angle of 45 degrees. Accordingly, the amount of heat transferred to the outer sides of the range 49 is small, and the effects obtained by providing the heat dissipation section 22 over such a wide range extending to the outer sides of the range 49 are small. Further, when the heat dissipation section 22 is provided over such a wide range extending to the outer sides of the range 49, the signal transmitted through the first conductor pattern 41 may easily make a wraparound to the heat dissipation section 22, to increase the loss. Hence, the heat dissipation section 22 is preferably bonded to the wiring board 40 in the range 49 or smaller, in order to reduce the loss.

Figure 14:
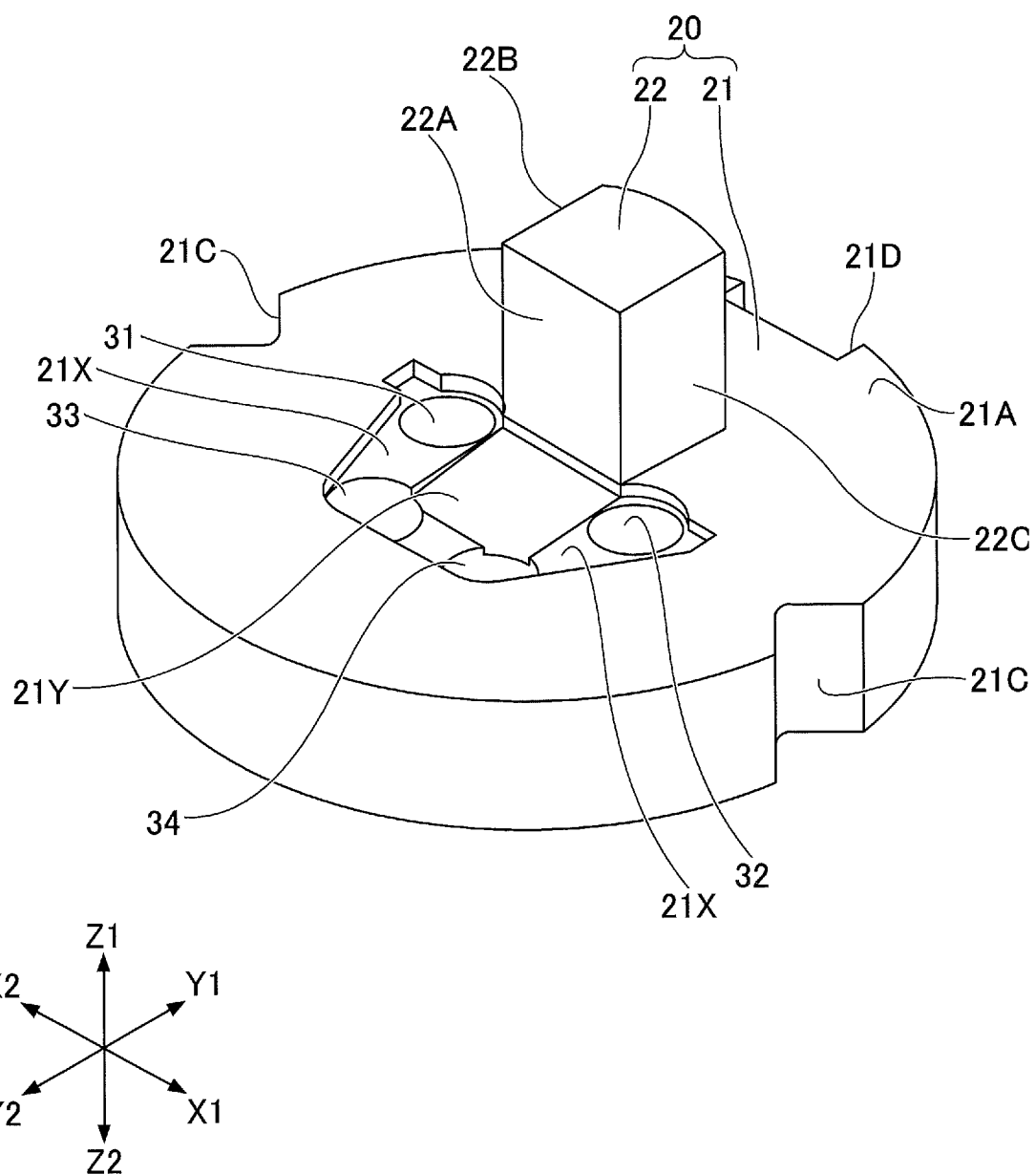
FIG. 14 is a perspective view illustrating the structure of the header for the semiconductor device according to a first modification of the first embodiment.

The planar shape of the cavity 21X is not particularly limited. As illustrated in FIG. 14, the cavity 21X may be formed to a shape that surrounds the through holes 33 and 34, for example. FIG. 14 is a perspective view illustrating the structure of the header for the semiconductor device according to a first modification of the first embodiment.

Figure 15:
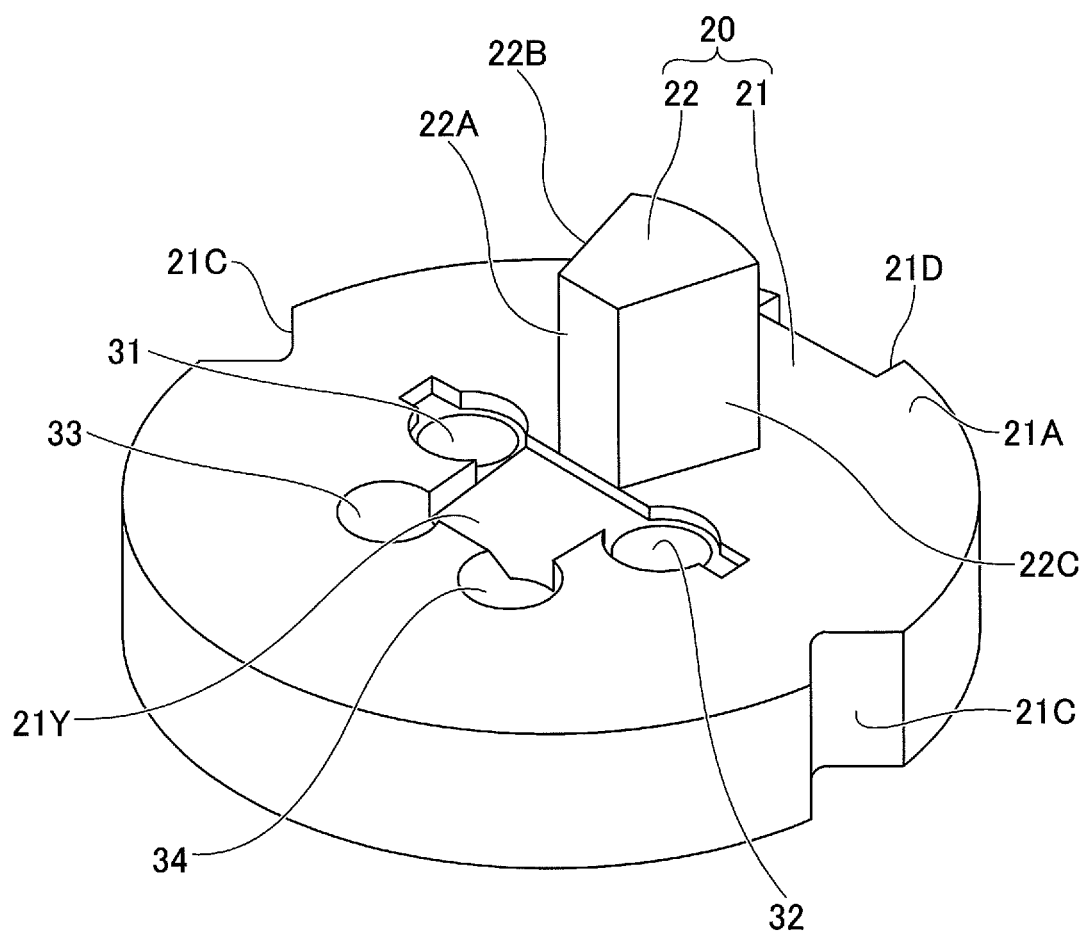
FIG. 15 is a perspective view illustrating the structure of the header for the semiconductor device according to a second modification of the first embodiment.
Figure 15:
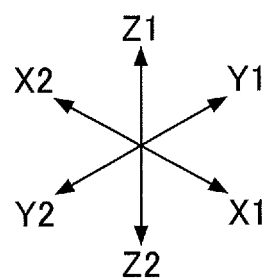

The planar shape of the heat dissipation section 22 is not particularly limited. As illustrated in FIG. 15, the heat dissipation section 22 may be formed to a shape such that the side surfaces 22B and 22C spread toward the Y1-side, for example. FIG. 15 is a perspective view illustrating the structure of the header for the semiconductor device according to a second modification of the first embodiment.

Second Embodiment

Figure 16:
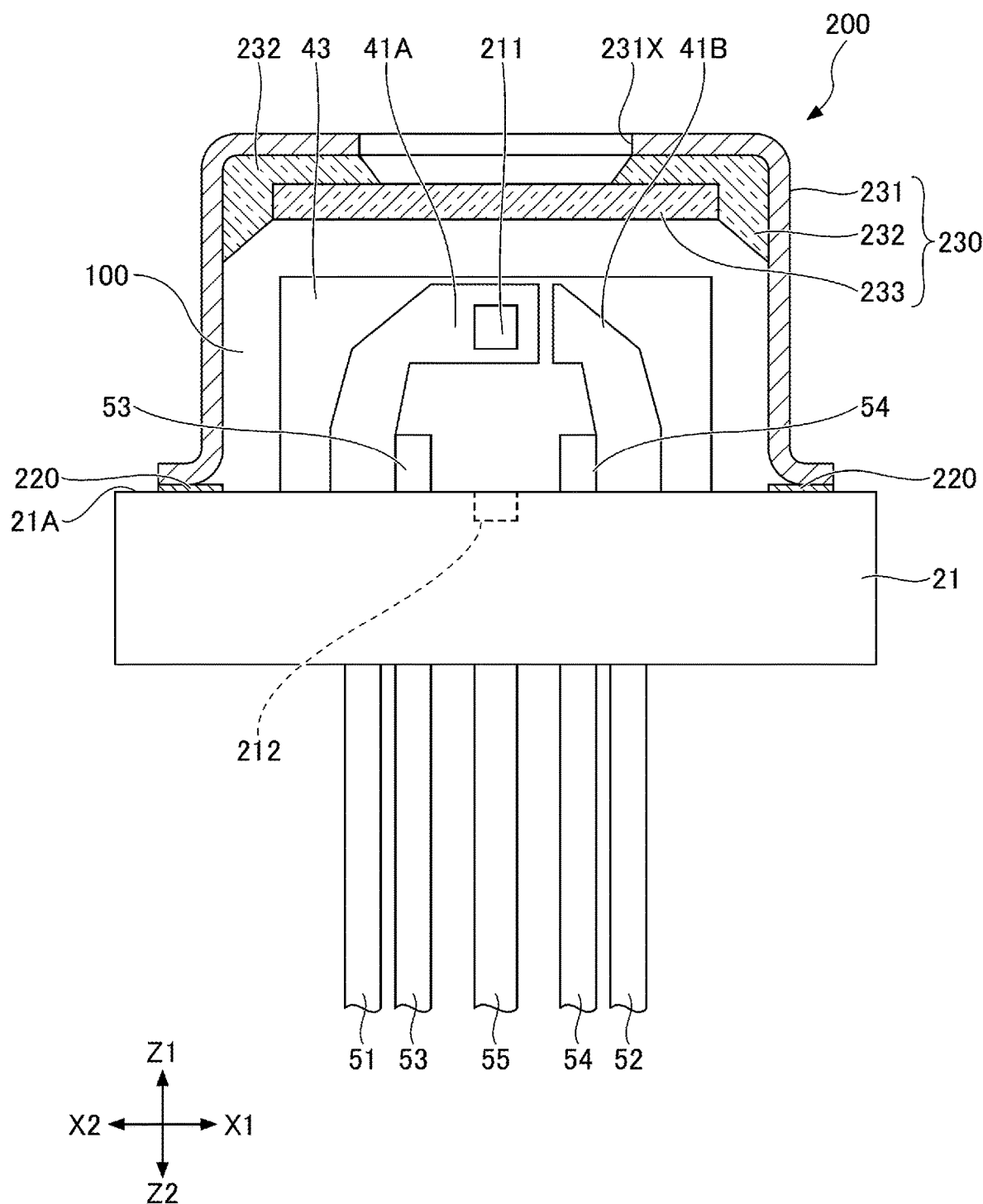
FIG. 16 is a cross sectional view, in part, illustrating the structure of the semiconductor device according to a second embodiment.

Next, a second embodiment will be described. The second embodiment relates to a semiconductor device including the header 100 according to the first embodiment. FIG. 16 is a cross sectional view, in part, illustrating the structure of the semiconductor device according to the second embodiment.

A semiconductor device 200 according to the second embodiment includes the header 100, a semiconductor element 211, a semiconductor element 212, a bonding section 220, and a cap 230. The semiconductor element 211 may be a light emitting element, for example. The light emitting element may be a semiconductor laser chip that emits light having a wavelength of 1310 nm, for example. The semiconductor element 212 may be a light receiving element, for example. The light receiving element may be a photodiode, for example.

The semiconductor element 211 is mounted on the mounting section 48 of the first conductor pattern 41 and fixed, in a state where a light emission surface (upper end surface in this example) of the semiconductor element 211 faces upward. More particularly, the semiconductor element 211 is mounted on the step 100 so that, in the plan view, the position of a light emission point of the semiconductor element 211 approximately coincides with the center of the upper surface 21A of the main body section 21. Electrodes of the semiconductor element 211 are electrically connected to the conductor patterns 41A and 41B by bonding wires or the like, for example. Accordingly, the signal leads 51 and 52 are electrically connected to the semiconductor element 211 via the conductor patterns 41A and 41B, respectively.

The semiconductor element 212 is mounted on the sloping surface 21Y. Electrodes of the semiconductor element 212 are electrically connected to the monitoring leads 53 and 54 by bonding wires or the like, for example.

The bonding section 220 is formed on the upper surface 21A of the main body section 21, so as to surround the heat dissipation section 22, the signal leads 51 and 52, and the monitoring leads 53 and 54. The bonding section 220 is formed to an approximate ring shape, for example. The bonding section 220 may be formed by a metal layer in which highly corrosive-resistant nickel (Ni) layer and a gold (Au) layer are successively laminated, for example. The Ni layer and the Au layer may be formed by plating, for example.

The cap 230 is formed to a hollow hat shape. The cap 230 includes a main cap body 231, and a transparent member 234. The main cap body 231 has a cylinder-like shape with an opening (or window) 231X provided at a center of a top plate portion thereof in the plan view. The transparent member 234 is provided below the opening 231X and is sealed by an adhesive 233. An outer peripheral bottom portion of the main cap body 231 is curved toward the outer side, and forms an annular (toric in this example) flange 232. The cap 230 is bonded to the eyelet 20 by bonding a lower surface of the flange 232 onto the bonding section 220. Accordingly, the semiconductor element 211 that is fixed to the wiring board 40 is sealed airtight inside the cap 230. The bonding of the cap 230 with respect to the bonding section 220 may be performed by resistance welding, for example.

Examples of the material used for the main cap body 231 include metals, such as iron, steel, copper, or the like, and alloys including at least one of such metals, for example. Examples of the material used for the adhesive 233 include low-melting glass, for example. Examples of the material used for the transparent member 234 include glass, for example. Of course, the opening 231X, the adhesive 233, and the transparent member 234 of the cap 230 may be omitted, as appropriate. In addition, the bonding section 220 may be omitted, and in this case, the cap 230 may be directly bonded to the upper surface 21A of the main body section 21 by welding or the like, for example.

In the semiconductor device 200 according to the second embodiment, the light emitted from the light emission surface (upper end surface in this example) of the semiconductor element 211 is transmitted through the transparent member 234, and emitted toward the Z1-side (upward in this example) via the opening 231X. In addition, the light emitted from the lower end surface of the semiconductor element 211 is received by the semiconductor element 212. For example, by monitoring the amount of light emitted from the semiconductor element 211 and controlling the amount of light received by the semiconductor element 212 to become constant by a circuit that is arranged externally to the semiconductor device 200, it is possible to maintain the amount of light emitted from the semiconductor device 200 constant regardless of the ambient temperature or the like.

Next, functions of the semiconductor device 200 will be described.

In the semiconductor device 200, the signal lead 51, that is sealed inside the through hole 31 by the sealer 61, is electrically connected to the conductor pattern 41A, and the conductor pattern 41A is electrically connected to the semiconductor element 211 by a bonding wire or the like. In addition, the signal lead 52, that is sealed inside the through hole 32 by the sealer 62, is electrically connected to the conductor pattern 41B, and the conductor pattern 41B is electrically connected to the semiconductor element 211 by a bonding wire or the like. Hence, the upper end portions of the signal leads 51 and 52 are electrically connected to the semiconductor element 211 via the first conductor pattern 31. On the other hand, the lower end portions of the signal leads 51 and 52 are electrically connected to an external electrical circuit (not illustrated), for example. Accordingly, the signal leads 51 and 52 have the function of transmitting high-frequency input and output signals between the semiconductor element 211 and the external electrical circuit.

The portion of the signal lead 51 sealed inside the through hole 31 by the sealer 61, and the portion of the signal lead 32 sealed inside the through hole 32 by the sealer 62, form coaxial lines (coaxial structures). For this reason, it is possible to easily adjust the characteristic impedance of the signal leads 51 and 52, by adjusting the diameter of the signal leads 51 and 52, the diameter of the openings of the through holes 31 and 32, and the relative permittivity of the sealers 61 and 62. By suitably adjusting the diameter of the opening of the through holes 31 and 32, for example, it is possible to match the characteristic impedance of the signal leads 51 and 52 to a desired characteristic impedance value of 25Ω, for example. This desired characteristic impedance value may be the characteristic impedance of a circuit or the like formed in the semiconductor element 211, for example. Further, as described above, the characteristic impedance of the first conductor pattern 41 can also be easily adjusted to a desired characteristic impedance value. Hence, the entire transmission channel of the semiconductor device 200 can be made into a transmission line having the matching characteristic impedance. As a result, the reflectance loss of the high-frequency signal can be reduced, and satisfactory high-frequency signal transmission characteristics can be maintained.

Although preferable embodiments or the like are described above, the present invention is not limited to the described embodiments, and various variations, modifications, and substitutions may be made without departing from the scope of the present invention.

For example, the shapes of the first conductor pattern 41 and the second conductor pattern 42 are not particularly limited. In addition, a resin substrate, such as a glass epoxy substrate or the like, for example, may be used for the substrate 43.

For example, the positions of the upper end surfaces of the signal leads 51 and 52 are not particularly limited, as long as the signal lead 51 and the conductor pattern 41A can be electrically connected, and the signal lead 52 and the conductor pattern 41B can be electrically connected. For example, the upper end surfaces of the signal leads 51 and 52 may project upward from the bottom surface of the cavity 21X.

For example, the signal leads 51 and 52 may be formed to polygonal column shapes, such as triangular column shapes, rectangular column shapes, or the like, and elliptic column shapes, or the like. The cross sectional shapes of the through holes 31 and 32 may be polygonal shapes, such as triangular shapes, rectangular shapes, or the like, and elliptic shapes, or the like. However, the cross sectional shapes of the through holes 31 and 32 are preferably similar to the cross sectional shapes of the signal leads 51 and 52, respectively.

For example, the through holes 33 and 34, the monitoring leads 53 and 54, and the sealers 63 and 64 may be omitted.

Accordingly to each of the embodiments and modifications described above, it is possible to improve the frequencies of the signals that can be transmitted satisfactorily.

Although the embodiments and the modifications are numbered with, for example, "first," or "second," the ordinal numbers do not imply priorities of the embodiments and the modifications. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A header for a semiconductor device, comprising:
   a main body section having an upper surface, and a cavity formed in the upper surface;
   a heat dissipation section provided on the upper surface of the main body section; and
   a wiring board provided inside the cavity,
   wherein the wiring board includes
      a substrate having a first principal surface, and a second principal surface provided on an opposite side from the first principal surface,
      a first conductor pattern provided on the first principal surface, and having a mounting section on which a semiconductor element is mounted, and
      a second conductor pattern provided on the second principal surface, and bonded to an inner wall surface of the cavity and the heat dissipation section,
   wherein the wiring board and a portion of the first conductor pattern respectively extend beyond the heat dissipation section when viewed in a thickness direction of the wiring board, perpendicular to the first and second principal surfaces.

2. The header for the semiconductor device as claimed in claim 1, wherein the main body section and the heat dissipation section are integrally formed.

3. The header for the semiconductor device as claimed in claim 1, wherein
   the main body section includes a through hole penetrating the main body section in a thickness direction of the main body section to extend below the wiring board, and
   the through hole is separated from the heat dissipation section in a plan view viewed in a direction perpendicular to the upper surface of the main body section.

4. The header for the semiconductor device as claimed in claim 3, further comprising:
   a lead, inserted into the through hole, and electrically connected to the first conductor pattern.

5. The header for the semiconductor device as claimed in claim 4, wherein
   the lead includes
      a columnar portion having a first cross sectional area, and
      a head top portion having a second cross sectional area greater than the first cross sectional area, provided on one end of the columnar portion and electrically connected to the first conductor pattern.

6. The header for the semiconductor device as claimed in claim 1, wherein a portion of the second principal surface is exposed from the second conductor pattern.

7. The header for the semiconductor device as claimed in claim 1, wherein the heat dissipation section is bonded to the wiring board in a range at least overlapping the mounting section along the thickness direction of the wiring board.

8. The header for the semiconductor device as claimed in claim 3, wherein the heat dissipation section is bonded to the wiring board in a range at least overlapping the mounting section along the thickness direction of the wiring board.

9. The header for the semiconductor device as claimed in claim 4, wherein the heat dissipation section is bonded to the wiring board in a range at least overlapping the mounting section along the thickness direction of the wiring board.

10. The header for the semiconductor device as claimed in claim 5, wherein the heat dissipation section is bonded to the wiring board in a range at least overlapping the mounting section along the thickness direction of the wiring board.

11. The header for the semiconductor device as claimed in claim 1, wherein
   the heat dissipation section is bonded to the wiring board in a first range or smaller, and
   the first range is obtained by adding a thickness of the wiring board to both ends of a second range overlapping the mounting section along the thickness direction of the wiring board.

12. The header for the semiconductor device as claimed in claim 3, wherein
   the heat dissipation section is bonded to the wiring board in a first range or smaller, and
   the first range is obtained by adding a thickness of the wiring board to both ends of a second range overlapping the mounting section along the thickness direction of the wiring board.

13. The header for the semiconductor device as claimed in claim 4, wherein
   the heat dissipation section is bonded to the wiring board in a first range or smaller, and
   the first range is obtained by adding a thickness of the wiring board to both ends of a second range overlapping the mounting section along the thickness direction of the wiring board.

14. A semiconductor device comprising:
   the header for the semiconductor device according to claim 1; and
   a semiconductor element, mounted on the mounting section, and electrically connected to the first conductor pattern.

15. A semiconductor device comprising:
   the header for the semiconductor device according to claim 3; and
   a semiconductor element, mounted on the mounting section, and electrically connected to the first conductor pattern.

16. A semiconductor device comprising:
   the header for the semiconductor device according to claim 4; and
   a semiconductor element, mounted on the mounting section, and electrically connected to the first conductor pattern.

17. A semiconductor device comprising:
   the header for the semiconductor device according to claim 5; and
   a semiconductor element, mounted on the mounting section, and electrically connected to the first conductor pattern.

18. The header as claimed in claim 1, wherein
   the main body section includes a pair of through holes penetrating the main body section in a thickness direction of the main body section to extend below the wiring board, and
   the pair of through holes is separated from the heat dissipation section in a plan view viewed in a direction perpendicular to the upper surface of the main body section.

19. The header as claimed in claim 18, wherein the cavity has a sloping bottom surface below the mounting section, sloping downward in a direction away from the heat dissipation section, between the pair of through holes.

20. The header as claimed in claim 1, wherein
   a lower end of the wiring board is inserted into the cavity, and the second principal surface of the substrate is bonded to the inner wall surface of the cavity, and to a mounting surface of the heat dissipation section, perpendicular to the upper surface of the main body section.

* * * * *